United States Patent
Dyer et al.

(10) Patent No.: US 7,741,188 B2
(45) Date of Patent: Jun. 22, 2010

(54) DEEP TRENCH (DT) METAL-INSULATOR-METAL (MIM) CAPACITOR

(75) Inventors: Thomas W. Dyer, Pleasant Valley, NY (US); Eduard A. Cartier, New York, NY (US); Michael P. Chudzik, Danbury, NY (US); Naim Moumen, Walden, NY (US)

(73) Assignee: International Business Machines Corporation, Armonk, NY (US)

( * ) Notice: Subject to any disclaimer, the term of this patent is extended or adjusted under 35 U.S.C. 154(b) by 228 days.

(21) Appl. No.: 12/053,846

(22) Filed: Mar. 24, 2008

(65) Prior Publication Data

US 2009/0236691 A1 Sep. 24, 2009

(51) Int. Cl.
*H01L 21/20* (2006.01)
(52) U.S. Cl. ......... 438/386; 438/238; 438/239; 438/243; 438/399; 438/957; 257/296; 257/301; 257/347
(58) Field of Classification Search ......... 438/238, 438/239, 243, 386, 399, 957; 257/296, 301, 257/347
See application file for complete search history.

(56) References Cited

U.S. PATENT DOCUMENTS

| | | | |
|---|---|---|---|
| 5,395,786 A * | 3/1995 | Hsu et al. | 438/248 |
| 6,211,006 B1 * | 4/2001 | Tsai et al. | 438/246 |
| 6,340,615 B1 * | 1/2002 | Iyer et al. | 438/248 |
| 6,620,701 B2 | 9/2003 | Ning | |
| 6,734,489 B2 | 5/2004 | Morimoto et al. | |
| 6,794,262 B2 | 9/2004 | Ning et al. | |
| 6,909,137 B2 | 6/2005 | Divakaruni et al. | |
| 6,949,442 B2 | 9/2005 | Barth et al. | |
| 7,102,204 B2 * | 9/2006 | Berndlmaier et al. | 257/532 |
| 7,276,751 B2 | 10/2007 | Ho et al. | |
| 7,282,757 B2 | 10/2007 | Tu et al. | |
| 7,304,342 B2 | 12/2007 | Nirschl et al. | |
| 7,329,939 B2 | 2/2008 | Hsu et al. | |
| 7,473,979 B2 * | 1/2009 | Clevenger et al. | 257/532 |
| 7,575,970 B2 * | 8/2009 | Ho et al. | 438/246 |
| 2004/0248363 A1 * | 12/2004 | Bard et al. | 438/243 |
| 2007/0045697 A1 * | 3/2007 | Cheng et al. | 257/301 |
| 2009/0230508 A1 * | 9/2009 | Dyer et al. | 257/532 |

\* cited by examiner

*Primary Examiner*—Andy Huynh
(74) *Attorney, Agent, or Firm*—Joseph P. Abate; Howard M. Cohn

(57) ABSTRACT

A deep trench metal-insulator-metal (MIM) capacitor in an SOI-type substrate. In the deep trench, a layer of TiN, followed by a layer of high-k dielectric, followed by a second layer of TiN. The resulting capacitor is completely buried below the SOI layer, thereby allowing for subsequent structures to be placed over the deep trench.

16 Claims, 9 Drawing Sheets

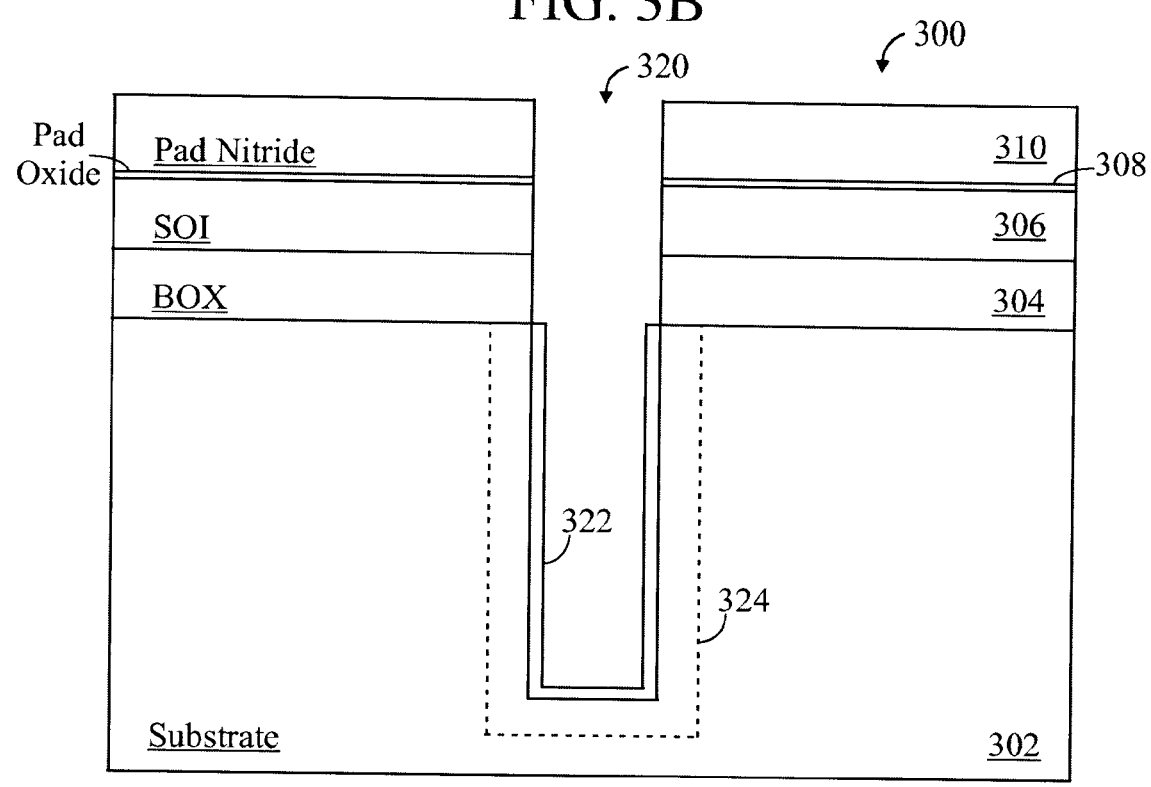

DEEP TRENCH (DT) METAL-INSULATOR-METAL (MIM) CAPACITOR

FIELD OF THE INVENTION

The invention relates to semiconductor devices and, more particularly to deep trench (DT) capacitors such as for dynamic random access memory (DRAM), including embedded DRAM (eDRAM).

BACKGROUND OF THE INVENTION

A memory cell in an integrated circuit (IC) may include a transfer device such as a transistor and an associated capacitor. The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals. One type of transistor is known as the field effect transistor (FET). The capacitor, which is typically formed in a portion of a trench, consists of a pair of conductive plates (electrodes), which are separated from each other by a node dielectric material. Information or data is stored in the memory cell in the form of charge accumulated on the capacitor. Since capacitors leak charge (generally, a capacitor is only useful for temporarily storing an electrical charge), the information (data) eventually fades unless the capacitor charge is refreshed (read, and re-written) periodically, such as every 64 ms (milliseconds).

DRAM (eDRAM)

Generally, the DRAM cells discussed herein comprise a capacitor formed in a deep trench (DT) in a substrate, and an "access transistor" formed on the surface of the substrate adjacent and atop the capacitor. The capacitor ("DT capacitor") generally comprises a first conductive electrode called the "buried plate" which is a heavily doped region of the substrate surrounding the trench, a thin layer of insulating material such as oxide lining the trench, and a second conductive electrode such as a heavily doped polycrystalline plug (or "node") disposed within the trench. The transistor may comprise a FET having one of its source/drain (S/D) terminals connected to (or an extension of) the second electrode (node) of the capacitor.

FIG. 1 illustrates a DRAM cell 100 of the prior art, generally comprising an access transistor and an associated cell capacitor. The DRAM cell is generally formed, as follows.

Beginning with a semiconductor substrate 102, a deep trench (DT) 110 is formed, extending into the substrate 102, from a top (as viewed) surface thereof. The substrate 102 may comprise a SOI substrate having a layer 106 of silicon (SOI) on top of an insulating layer 104 which is atop the underlying silicon substrate 102. The insulating layer 104 typically comprises buried oxide (BOX). The deep trench (DT) 110 is for forming the cell capacitor (or "DT capacitor"), as follows. The trench 110 may have a width of about 50 nm to 200 nm and a depth of 1000 nm to 10000 nm, by way of example.

The cell capacitor generally comprises a first conductor called the "buried plate" which is a heavily doped region 112 of the substrate surrounding the trench 110, a thin layer 114 of insulating material lining the trench 110, and a second conductor 116 such as a heavily doped polycrystalline plug (or "node", "DT poly") disposed within the trench 110. A cell transistor ("access transistor") 120 may comprise a FET having one of its source/drain (S/D) terminals connected to (or an extension of) the second conductor (node) of the capacitor, as follows.

The FET 120 comprises two spaced-apart diffusions, 122 and 124, within the surface of the substrate 102—one of which will serve as the "source" and the other of which will serve as the "drain" (D) of the transistor 120. The space between the two diffusion areas is called the "channel" (and is approximately where the legend "SOI" appears). A thin dielectric layer 126 is disposed on the substrate above the channel, and a "gate" structure (G) 128 is disposed over the dielectric layer 126, thus also atop the channel. (The dielectric under the gate is also commonly referred to as "gate oxide" or "gate dielectric".) The gate 128 may be a portion of an elongate wordline (WL).

In modern CMOS technology, shallow trench isolation (STI) is commonly used to isolate one (or more) transistors from other transistors, for both logic and memory. As shown in FIG. 1, a shallow trench 132 may be formed, surrounding the access transistor 120 (only one side of the transistor is shown). Note that the trench 132 extends over the DT (node) poly 116, a top portion of which is adjacent the drain (D) of the transistor 120. Therefore, the trench 132 is less deep (thinner) over the DT poly 116 and immediately adjacent the drain (D) of the transistor 120, and may be deeper (thicker) further from the drain (D) of the transistor 120 (and, as shown, over top portion of the DT poly 116 which is distal from (not immediately adjacent to) the drain (D) of the transistor 120.

The STI trench 132 may be filled with an insulating material, such as oxide (STI oxide) 134. Because of the thin/thick trench geometry which has been described, the STI oxide will exhibit a thin portion 134a where it is proximal (adjacent to) the drain (D) of the transistor 120, and a thicker portion where it is distal from (not immediately adjacent to) the drain (D) of the transistor 120.

Although not shown, the deep trench (DT) may be "bottle-shaped", such that it is wider in the substrate under the BOX, and a thinner bottleneck portion of the trench extends through the BOX (and overlying SOI, not shown). The deep trench is typically filled with poly (DT Poly, compare 116), there is a lining of insulator (compare 114), and the trench is surrounded by the buried plate (compare 112). This forms deep trench capacitor, which is generally not limited to SOI.

FIG. 2 illustrates an SOI substrate 200 with pad films and a hard mask, and represents first step in an overall process of providing SOI protection for implanted buried plate.

The overall substrate 200 is an SOI-type substrate having a layer 206 of silicon ("SOI") atop a buried oxide (BOX, insulator) layer 204, which is atop an underlying substrate 202 which may be a silicon substrate. The BOX layer 204 may have a thickness of 500-2500 Å (50-250 nm). The silicon (SOI) layer 206 may have a thickness of 50-200 Å (5-20 nm).

Pad films comprising a layer 208 of oxide and a layer 210 of nitride are disposed atop the SOI layer 206. The pad oxide layer 208 may have a thickness of 10-20 Å (1-2 nm), and the pad nitride layer 210 may have a thickness of 400-1500 Å (40-150 nm).

SOI Substrates

Silicon on insulator technology (SOI) refers to the use of a layered silicon-insulator-silicon substrate in place of conventional silicon substrates in semiconductor manufacturing, especially microelectronics. SOI-based devices differ from conventional silicon-built devices in that the silicon junction is above an electrical insulator, typically silicon dioxide or (less commonly) sapphire. The choice of insulator depends largely on intended application, with sapphire being used for radiation-sensitive applications and silicon oxide preferred for improved performance and diminished short channel effects in microelectronics devices. The precise thickness of the insulating layer and topmost silicon layer also vary widely with the intended application.

SiO2-based SOI substrates (or wafers) can be produced by several methods:

SIMOX—Separation by IMplantation of OXygen—uses an oxygen ion beam implantation process followed by high temperature annealing to create a buried SiO2 layer.

Wafer Bonding—the insulating layer is formed by directly bonding oxidized silicon with a second substrate. The majority of the second substrate is subsequently removed, the remnants forming the topmost Si layer.

Seed methods—wherein the topmost Si layer is grown directly on the insulator. Seed methods require some sort of template for homoepitaxy, which may be achieved by chemical treatment of the insulator, an appropriately oriented crystalline insulator, or vias through the insulator from the underlying substrate.

RELATED PATENTS AND PUBLICATIONS

U.S. Pat. No. 7,304,342 (2007), incorporated by reference herein, discloses semiconductor memory cell and associated fabrication method. A semiconductor memory cell and an associated fabrication method are provided in which a storage capacitor is connected to a selection transistor. The storage capacitor is formed in a trench of a semiconductor substrate. At the trench surface, a capacitor dielectric and an electrically conductive filling layer are formed thereon for realization of a capacitor counterelectrode. The filling layer has a projection that extends outside the trench as far as the drain region and is electrically connected thereto.

U.S. Pat. No. 6,909,137 (IBM, 2005), incorporated by reference herein, discloses method of creating deep trench capacitor using a P+ metal electrode. The method includes the steps of providing a substrate; forming a trench in the substrate; forming a buried plate in the substrate about the trench; depositing a dielectric layer within the trench; and then depositing a P-type metal atop the dielectric layer, where the dielectric layer is positioned between the P-type metal and the buried plate. Another aspect is directed to providing a trench capacitor where said trench capacitor comprises a trench formed in a substrate, a buried plate formed in the substrate about the trench; a node dielectric; and a P-type metal liner deposited within the trench, where the P-type metal liner is separated from the buried plate by the node dielectric. A P-type metal is defined as a metal having a work function close to the Si valence band, approximately equal to 5.1 eV.

U.S. Pat. No. 7,329,939 (IBM, 2008), incorporated by reference herein, discloses metal-insulator-metal capacitor and method of fabricating same. A metal-insulator-metal (MIM) capacitor including a metal layer, an insulating layer formed on the metal layer, at least a first opening and at least a second opening formed in the first insulating layer, a dielectric layer formed in the first opening, a conductive material deposited in the first and second openings, and a first metal plate formed over the first opening and a second metal plate formed over the second opening. A method for fabricating the MIM capacitor, includes forming the first metal layer, forming the insulating layer on the first metal layer, forming at least the first opening and at least the second opening in the first insulating layer, depositing a mask over the second opening, forming the dielectric layer in the first opening, removing the mask, depositing the conductive material in the first and second openings, and depositing a second metal layer over the first and second openings. MIM capacitors and methods of fabricating same are described, wherein the MIM capacitors are formed simultaneously with the BEOL interconnect and large density MIM capacitors are fabricated at low cost.

U.S. Pat. No. 7,282,757 (2007), incorporated by reference herein, discloses MIM capacitor structure and method of manufacture. A metal-insulator-metal (MIM) capacitor structure and method of manufacturing thereof. A plurality of MIM capacitor patterns is formed in two or more insulating layers. The insulating layers may comprise a via layer and a metallization layer of a semiconductor device. A top portion of the top insulating layer is recessed in a region between at least two adjacent MIM capacitor patterns. When the top plate material of the MIM capacitors is deposited, the top plate material fills the recessed area of the top insulating layer between the adjacent MIM capacitor pattern, forming a connecting region that couples together the top plates of the adjacent MIM capacitors. A portion of the MIM capacitor bottom electrode may be formed in a first metallization layer of the semiconductor device.

U.S. Pat. No. 7,276,751 (IBM, 2007), incorporated by reference herein, discloses trench metal-insulator-metal (MIM) capacitors integrated with middle-of-line metal contacts, and method of fabricating same. A semiconductor device contains at least one trench metal-oxide-metal (MIM) capacitor and at least one other logic circuitry component, preferably at least one field effect transistor (FET). The trench MIM capacitor is located in a trench in a substrate and comprises inner and outer metallic electrode layers with a dielectric layer therebetween. The FET comprises a source region, a drain region, a channel region, and at least one metal contact connected with the source or drain region. Also, a fabrication process, which integrates the processing steps for fabricating the trench MIM capacitor with the conventional middle-of-line processing steps for fabricating metal contacts, so that the inner metallic electrode layer of the trench MIM capacitor and the metal contact of the FET or other logic circuitry components are formed by a single middle-of-line processing step and comprise essentially the same metallic material.

U.S. Pat. No. 6,949,442 (2005), incorporated by reference herein, discloses methods of forming MIM capacitors. A method for forming a MIM capacitor and a MIM capacitor device formed by same. A preferred embodiment comprises selectively forming a first cap layer over a wafer including a MIM capacitor bottom plate, and depositing an insulating layer over the MIM capacitor bottom plate. The insulating layer is patterned with a MIM capacitor top plate pattern, and a MIM dielectric material is deposited over the patterned insulating layer. A conductive material is deposited over the MIM dielectric material, and the wafer is planarized to remove the conductive material and MIM dielectric material from the top surface of the insulating layer and form a MIM capacitor top plate. A second cap layer is selectively formed over the MIM capacitor top plate.

U.S. Pat. No. 6,794,262 (2004), incorporated by reference herein, discloses MIM capacitor structures and fabrication methods in dual-damascene structures. A metal-insulator-metal (MIM) capacitor (242/252) structure and method of forming the same. A dielectric layer (214) of a semiconductor device (200) is patterned with a dual damascene pattern having a first pattern (216) and a second pattern (218). The second pattern (218) has a greater depth than the first pattern (216). A conductive layer (226) is formed over the dielectric layer (214) in the first pattern, and a conductive layer is formed over the conductive layer in the first pattern (216). A dielectric layer (232), conductive layer (234), dielectric layer (236) and conductive layer (238) are disposed over the conductive layer (226) of the second pattern (218). Conductive layer (234), dielectric layer (232) and conductive layer (226) form a first MIM capacitor (252). Conductive layer (238), dielectric layer (236) and conductive layer (234) form a second MIM capacitor (242) parallel to the first MIM capacitor (242).

U.S. Pat. No. 6,734,489 (2004), incorporated by reference herein, discloses semiconductor element and MIM-type capacitor formed in different layers of a semiconductor device. A second-level wire is formed by a dual damascene process in a insulating film. In an upper surface of the first insulating film a metal film is formed and serves as a first electrode of an MIM-type capacitor. A second insulating films has a structure in which a plurality of insulating films are layered on a second interconnection layer, in this order. In a first insulating film of the plurality of insulating films, a second electrode of the MIM-type capacitor is formed. The second electrode has a first metal film formed on a second insulating film of the plurality of the insulating films and a second metal film is formed on the first metal film. A portion of the second insulating film which is sandwiched between the first electrode and the second electrode of the MIM-type capacitor serves as a capacitor dielectric film of the MIM-type capacitor. In the second insulating film, a third-level wire is formed. Thus, a semiconductor device and a method of manufacturing the same are provided such that the MIM-type capacitor is formed together with metal wires with no additional complicated step.

U.S. Pat. No. 6,620,701 (2003), incorporated by reference herein, discloses method of fabricating a metal-insulator-metal (MIM) capacitor. A method of manufacturing a metal-insulator-metal capacitor (MIMCap) (36) including first conductive lines (15), capacitor dielectric (26) and second conductive lines (28), the MIMCap (36) including horizontal capacitive portions (32) and vertical capacitive portions (34). The method includes forming first conductive lines (15) in a first insulating layer (14) of a wafer (10), depositing a second insulating layer (22), depositing a resist, removing portions of the resist, removing exposed portions of the second insulating layer (22) and portions of the first insulating layer (14), removing the remaining resist, and then depositing a capacitor dielectric (26) and second conductive lines (28).

Glossary

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

ALD short for atomic layer deposition. ALD is a gas phase chemical process used to create extremely thin coatings. The majority of ALD reactions use two chemicals, typically called precursors. These precursors react with a surface one-at-a-time in a sequential manner. By exposing the precursors to the growth surface repeatedly, a thin film is deposited. ALD is a self-limiting, sequential surface chemistry that deposits conformal thin-films of materials onto substrates of varying compositions. ALD is similar in chemistry to chemical vapor deposition (CVD), except that the ALD reaction breaks the CVD reaction into two half-reactions, keeping the precursor materials separate during the reaction. ALD film growth is self-limited and based on surface reactions, which makes achieving atomic scale deposition control possible. By keeping the precursors separate throughout the coating process, atomic layer control of film grown can be obtained as fine as ~0.1 angstroms per monolayer. ALD has unique advantages over other thin film deposition techniques, as ALD grown films are conformal, pin-hole free, and chemically bonded to the substrate. With ALD it is possible to deposit coatings perfectly uniform in thickness inside deep trenches, porous media and around particles. The film thickness range is usually 1-500 nm. ALD can be used to deposit several types of thin films, including various ceramics, from conductors to insulators.

anisotropic literally, one directional. An example of an anisotropic process is sunbathing. Only surfaces of the body exposed to (facing in the direction of) the sun become tanned. Anisotropic means "not the same in all directions" or "not isotropic". See isotropic.

capacitor A capacitor is a two-terminal device (electrical or electronic component) that can store energy in the electric field between a pair of conductive electrodes (called "plates"). The process of storing energy in the capacitor is known as "charging", and involves electric charges of equal magnitude, but opposite polarity, building up on each plate.

CMP short for chemical-mechanical polishing. CMP is a process, using both chemicals and abrasives, comparable to lapping (analogous to sanding), for removing material from a built up structure. For example, after depositing and etching a number of elements, the top surface of the resulting structure may very uneven, needing to be smoothed (or leveled) out, prior to performing a subsequent process step. Generally, CMP will level out the high spots, leaving a relatively smooth planar surface.

CVD short for chemical vapor deposition. CVD is a chemical process used to produce high-purity, high-performance solid materials. The process is often used in the semiconductor industry to produce thin films. In a typical CVD process, the wafer (substrate) is exposed to one or more volatile precursors, which react and/or decompose on the substrate surface to produce the desired deposit. CVD is used to deposit materials in various forms, including: monocrystalline, polycrystalline, amorphous, and epitaxial. These materials include: silicon, oxide, nitride and metals, such as are commonly used in semiconductor fabrication.

deposition Deposition generally refers to the process of applying a material over another material (or the substrate). Chemical vapor deposition (CVD) is a common technique for depositing materials. Other "deposition" techniques, such as for applying resist or glass, may include "spin-on", which generally involves providing a stream of material to the substrate, while the substrate is spinning, resulting in a relatively thin, flat, evenly-distributed coating of the material on the underlying substrate.

dielectric A dielectric is a non-conducting material or substance. (A dielectric is an electrical insulator.) Some dielectrics commonly used in semiconductor technology are SiO2 ("oxide") and Si3N4 ("nitride"). The insulating quality of a dielectric may be characterized by "k", the dielectric constant. Generally, the higher the "k", the better the insulating quality of the dielectric. Oxide, for example, has a k of approximately 3.9. A class of materials, referred to as "high-k" (or "high-K") dielectrics, have a dielectric constant higher than that of oxide (k>3.9).

dopant element introduced into semiconductor to establish either p-type (acceptors) or n-type (donors) conductivity; common dopants in silicon: for p-type—boron (B), Indium (In); for n-type—phosphorous (P) arsenic (As), antimony (Sb). Dopants are of two types—"donors" and "acceptors". N type implants are donors and P type are acceptors.

doping doping is the process of introducing impurities (dopants) into the semiconductor substrate, or elements formed on the semiconductor substrate, and is often performed with a mask (or previously-formed elements in place) so that only certain areas of the substrate will be doped. For example, doping is used to form the source and drain regions of an FET. An ion implanter is typically employed for the actual implantation. An inert carrier gas such as nitrogen is usually used to bring in the impurity source (dopant).

Usually in doping, a dopant, a dosage and an energy level are specified and/or a resulting doping level may be specified. A dosage may be specified in the number of atoms per $cm^2$ and an energy level (specified in keV, kilo-electron-volts), resulting in a doping level (concentration in the substrate) of a number of atoms per $cm^3$. The number of atoms is commonly specified in exponential notation, where a number like "3E15" means 3 times 10 to the 15th power, or a "3" followed by 15 zeroes (3,000,000,000,000,000). To put things in perspective, there are about 1E23 (100,000,000,000,000,000,000,000) atoms of hydrogen and oxygen in a cubic centimeter ($cm^3$) of water.

An example of doping is implanting with B (boron) with a dosage of between about 1E12 and 1E13 atoms/$cm^2$, and an energy of about 40 to 80 keV to produce a doping level of between 1E17 and 1E18 atoms/$cm^3$. ("/$cm^3$" may also be written "$cm^{-3}$"

DRAM short for dynamic random access memory. DRAM is a type of random access memory that stores each bit of data in a separate capacitor within an integrated circuit. Since real capacitors leak charge, the information eventually fades unless the capacitor charge is refreshed periodically. Because of this refresh requirement, it is a dynamic memory as opposed to SRAM and other static memory. Its advantage over SRAM is its structural simplicity: only one transistor and a capacitor are required per bit, compared to six transistors in SRAM. This allows DRAM to reach very high density. Like SRAM, it is in the class of volatile memory devices, since it loses its data when the power supply is removed.

eDRAM short for embedded DRAM. eDRAM is a capacitor-based dynamic random access memory usually integrated on the same die or in the same package as the main ASIC or processor, as opposed to external DRAM modules and transistor-based SRAM typically used for caches.

etching etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch.

Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically.

Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

FET short for field effect transistor. The FET is a transistor that relies on an electric field to control the shape and hence the conductivity of a "channel" in a semiconductor material. FETs are sometimes used as voltage-controlled resistors. The terminals of FETs are designated source (S), drain (D) and gate (0).

isotropic literally, identical in all directions. An example of an isotropic process is dissolving a tablet in water. All exposed surfaces of the tablet are uniformly acted upon. (see "anisotropic")

lithography In lithography (or "photolithography"), a radiation sensitive "resist" coating is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The pattered resist can then serve as a mask for the underlying layers which can then be selectively treated, such as to receive dopants and/or to undergo etching, for example.

mask The term "mask" may be given to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask".

metallization Metallization refers to formation of metal contacts and interconnects in the manufacturing of semiconductor devices. This generally occurs after the devices are completely formed, and ready to be connected with one another. A first level or layer of metallization is usually referred to as "M1".

nitride commonly used to refer to silicon nitride (chemical formula Si3N4). A dielectric material commonly used in integrated circuit manufacturing. Forms an excellent mask (barrier) against oxidation of silicon (Si). Nitride is commonly used as a hard mask (HM).

n-type semiconductor in which concentration of electrons is higher than the concentration of "holes". See p-type.

oxide commonly used to refer to silicon dioxide (SiO2). Also known as silica. SiO2 is the most common insulator in semiconductor device technology, particularly in silicon MOS/CMOS where it is used as a gate dielectric (gate oxide); high quality films are obtained by thermal oxidation of silicon. Thermal SiO2 forms a smooth, low-defect interface with Si, and can be also readily deposited by CVD. Oxide may also be used to fill STI trenches, form spacer structures, and as an inter-level dielectric, for example.

plasma etching Plasma etching refers to dry etching in which semiconductor wafer is immersed in plasma containing etching species; chemical etching reaction is taking place at the same rate in any direction, i.e. etching is isotropic; can be very selective; used in those applications in which directionality (anisotropy) of etching in not required, e.g. in resist stripping.

poly short for polycrystalline silicon (Si). Heavily doped poly Si is commonly used as a gate contact in silicon MOS and CMOS devices;

p-type semiconductor in which concentration of "holes" is higher than the concentration of electrons. See n-type. Examples of p-type silicon include silicon doped (enhanced) with boron (B), Indium (In) and the like.

resist short for photoresist. also abbreviated "PR". Photoresist is often used as a masking material in photolithographic processes to reproduce either a positive or a negative image on a structure, prior to etching (removal of material which is not masked). PR is usually washed off after having served its purpose as a masking material.

RIE short for Reactive Ion Etching. RIE is a variation of plasma etching in which during etching, the semiconductor wafer is placed on an RF powered electrode. The plasma is generated under low pressure (vacuum) by an electromagnetic field. It uses chemically reactive plasma to remove material deposited on wafers. High-energy ions from the plasma attack the wafer surface and react with it. The wafer takes on potential which accelerates etching species extracted from plasma toward the etched surface. A chemical etching reaction is preferentially taking place in the direction normal to the surface—in other words, etching is more anisotropic than in plasma etching but is less selective. RIE typically leaves the etched surface damaged. RIE is a very common etching mode in semiconductor manufacturing.

Si Silicon, a semiconductor.

SI units The International System of Units (abbreviated SI from the French Le Système international d'unités) is the modern form of the metric system and is generally a system devised around the convenience of the number 10. It is the world's most widely used system of units, both in everyday commerce and in science. The SI system of units consists of a set of units together with a set of prefixes. There are seven "base units", which are meter (abbreviated "m", for length), kilogram (abbreviated "kg", for mass), second (abbreviated "s", for time), Ampere (abbreviated "A", for electric current), Kelvin (abbreviated "K", for thermodynamic temperature), mole (abbreviated "mol", for the amount of a substance), and candela (abbreviated "cd", for luminous intensity). A prefix may be added to the units to produce a multiple of the original unit. All multiples are integer powers of ten. For example, "kilo" denotes a multiple of a thousand and "milli" denotes a multiple of one-thousandth. Hence there are one thousand millimeters to the meter and one thousand meters to the kilometer.

SOI short for silicon-on-insulator. Silicon on insulator (SOI) technology refers to the use of a layered silicon-insulator-silicon substrate in place of a conventional silicon substrate in semiconductor manufacturing, especially microelectronics. SOI-based devices differ from conventional silicon-built devices in that the silicon junction is above an electrical insulator, typically silicon dioxide or (less commonly) sapphire.

STI short for shallow trench isolation. Generally, a trench etched into the substrate and filled with an insulating material such as oxide, to isolate one region of the substrate from an adjacent region of the substrate. One or more transistors of a given polarity may be disposed within an area isolated by STI.

substrate typically a wafer, of semiconductor material such as silicon, germanium, silicon germanium, silicon carbide, and those consisting essentially of III-V compound semiconductors such as GaAs, II-VI compound semiconductors such as ZnSe. A substrate may also comprise an organic semiconductor or a layered semiconductor such as, for example, Si/SiGe, a silicon-on-insulator or a SiGe-on-insulator. A portion or entire semiconductor substrate may be amorphous, polycrystalline, or monocrystalline. A substrate is often covered by an oxide layer (sometimes referred to as a "pad oxide layer"). Pad oxide is usually relatively thin, e.g., in the range of about 50 to about 500 Angstroms (5-50 nm), and can be formed, for example, by thermal oxidation of the substrate. Pad oxide may also be prepared by other methods. For example, silicon dioxide or reactive precursors like silane could be deposited by chemical vapor deposition (CVD). A nitride layer (sometimes referred to as a "pad nitride layer") may be formed to protect the pad oxide and the underlying substrate during various processing steps. It usually has a thickness in the range of about 100 Angstroms to about 6000 Angstroms (10-600 nm), such as in the range of about 1500 Angstroms to about 3000 Angstroms (150-300 nm). Conventional means can be used to apply the pad nitride, such as chemical vapor deposition (CVD).

transistor A transistor is a semiconductor device, commonly used as an amplifier or an electrically controlled switch. The transistor is the fundamental building block of the circuitry in computers, cellular phones, and all other modern electronic devices. Because of its fast response and accuracy, the transistor is used in a wide variety of digital and analog functions, including amplification, switching, voltage regulation, signal modulation, and oscillators. Transistors may be packaged individually or as part of an integrated circuit, some with over a billion transistors in a very small area. See FET.

Units of Length Various units of length may be used herein, as follows:
  meter (m) A meter is the SI unit of length, slightly longer than a yard.
    1 meter=~39 inches. 1 kilometer (km)=1000 meters=~0.6 miles.
    1,000,000 microns=1 meter. 1,000 millimeters (mm)=1 meter.
    100 centimeters (cm)=1 meter.
  micron (μm) one millionth of a meter (0.000001 meter); also referred to as a micrometer.
  mil 1/1000 or 0.001 of an inch; 1 mil=25.4 microns.
  nanometer (nm) one billionth of a meter (0.000000001 meter).
  Angstrom (?) one tenth of a billionth of a meter. 10 ?=1 nm.

V short for voltage. Different voltages may be applied to different parts of a transistor or memory cell to control its operation.

wafer In microelectronics, a wafer is a thin slice of semiconducting material, such as a silicon crystal, upon which microcircuits are constructed. There are multiple orientation planes in the silicon crystal that can be used. The planes are defined by the "Miller Indices" methodology. Common orientations classified by the "Miller indices" are (100), (011), (110), and (111).

work function The work function is the minimum energy (usually measured in electron volts) needed to remove an electron from a solid to a point immediately outside the solid surface (or energy needed to move an electron from the Fermi energy level into vacuum). Here "immediately" means that the final electron position is far from the surface on the atomic scale but still close to the solid on the macroscopic scale. The work function is an important property of metals. The magnitude of the work function is usually about a half of the ionization energy of a free atom of the metal.

SUMMARY OF THE INVENTION

It is a general object of the invention to provide an improved technique for forming deep trenches (DTs), such as for capacitors of DRAM cells, such as in SOI substrates, and the resulting DT capacitors formed therein.

This invention describes and teaches how to make a metal-insulator-metal (MIM) deep trench capacitor for use in DRAM (including eDRAM) applications. The metal for both the plate and the node may consist of a thin layer of titanium nitride (TiN), using atomic layer deposition (ALD). (ALD deposition is the enabling method for getting the thin conformal metal and dielectric films into the deep trench.) The plate may be deposited on arsenic (As) doped silicon, but the doping of the silicon may not be required. A thick layer of arsenic-doped poly-silicon or TiN is deposited over the node TiN used to fill the trench.

According to an embodiment of the invention, a method of forming a deep trench metal-insulator-metal (MIM) capacitor in an SOI-type substrate having a layer of silicon (SOI) atop a buried oxide (BOX) layer which is atop an underlying substrate comprises: forming a deep trench (DT) extending through the SOI layer and the BOX layer, and into the underlying substrate; depositing a thin, conformal layer of a first conductive material to serve as a first of two conductive electrodes for a capacitor being formed in the deep trench; removing a portion of the first conductive material from a top portion of the deep trench, recessing it to below the SOI layer; depositing a dielectric layer covering sidewalls and a bottom of the deep trench, and the first conductive material; filling the deep trench with a second conductive material, to serve as a second of the two conductive electrodes for a capacitor being formed in the deep trench; and recessing the second conductive material so that its top surface is recessed below the SOI layer.

The underlying substrate may be a silicon substrate; the BOX layer may have a thickness of 500-2500 Å; and the SOI layer may have a thickness of 50-200 Å. The deep trench (DT) may have a depth of 2000-5000 nm and a width of 50-150 nm.

The first conductive material may comprise titanium nitride (TiN), and may have a thickness of 5-10 nm. The first conductive material may be recessed to be above a top surface of the underlying substrate, or it may be recessed to be within the underlying substrate. The dielectric layer may comprise hafnium oxide, and may a thickness of 2-6 nm. The second conductive material may comprises titanium nitride (TiN), which may be a thin liner of titanium nitride (TiN) followed by a thick deposition of polysilicon. The second conductive material may be recessed to that its top surface is between bottom and top surfaces of the BOX layer.

Polysilicon may be deposited and etched back, such as to below a top surface of the SOI layer and above a bottom surface of the SOI layer, to form a strap on top of the second conductive material.

Etching may be performed to expose an underside of the SOI layer.

The method may further comprise forming a buried plate in the underlying substrate, surrounding the deep trench.

According to an embodiment of the invention, a deep trench metal-insulator-metal (MIM) capacitor in an SOI-type substrate having a layer of silicon (SOI) atop a buried oxide (BOX) layer which is atop an underlying substrate, comprises: a deep trench within the substrate; a first conductive material lining the deep trench and serving as a first electrode of the capacitor; a dielectric layer covering the first conductive material; and a second conductive material covering the first conductive material and serving as second electrode of the capacitor; wherein the resulting capacitor is completely buried below the SOI layer, thereby allowing for subsequent structures to be placed over the deep trench.

The first conductive material may comprise titanium nitride (TiN), and may have a thickness of 5-10 nm; the dielectric layer may comprise hafnium oxide, and may have a thickness of 2-6 nm; and the second conductive material may comprise titanium nitride (TiN).

The invention is generally applicable to any type of SOI substrate, such as SIMOX, Wafer Bonding and Seed method, as described above.

The invention is generally independent of any crystal orientation of the underlying substrate or SOI layer.

The invention is generally independent of subsequent access transistor type (design and layout), and may be useful for all DRAM and eDRAM in SOI substrates.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

In some of the figures, particularly cross-sectional views of semiconductor devices in various stages of fabrication, some elements may be drawn with very straight edges intersecting with other edges at precise (such as 90-degree) angles, for illustrative clarity. One of ordinary skill in the art will appreciate that the edges may not be so straight, and the intersections may be rounded, due to the nature of the processes (such as etching) used to form the various elements of the semiconductor devices.

Figure 1:
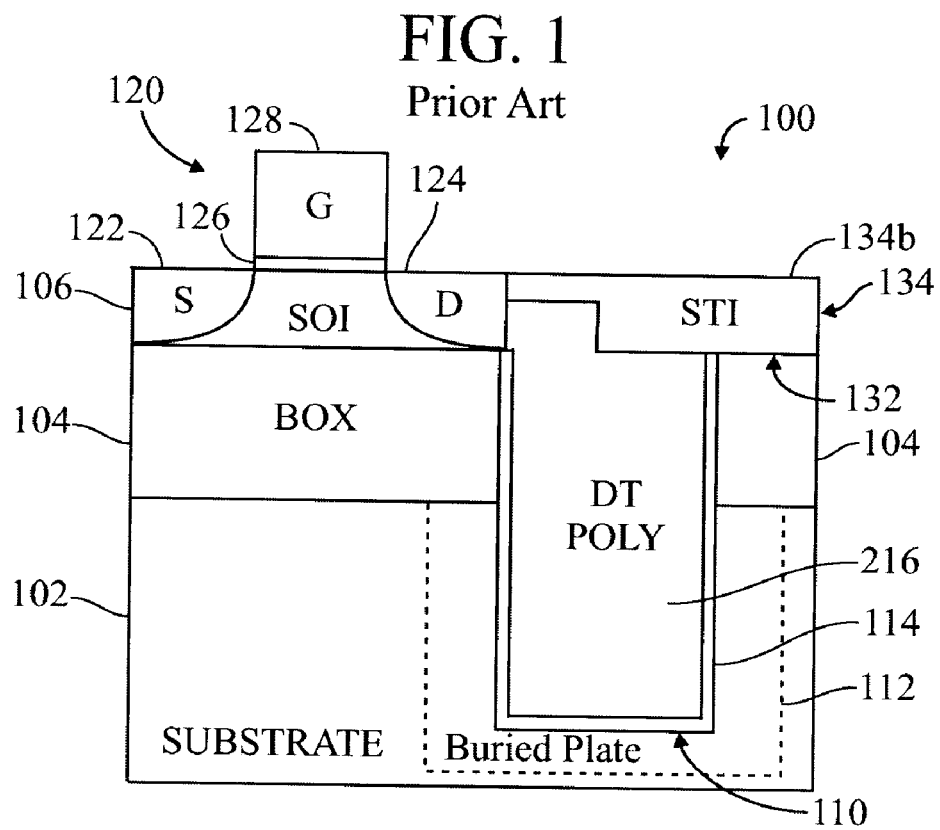
Figure 2:
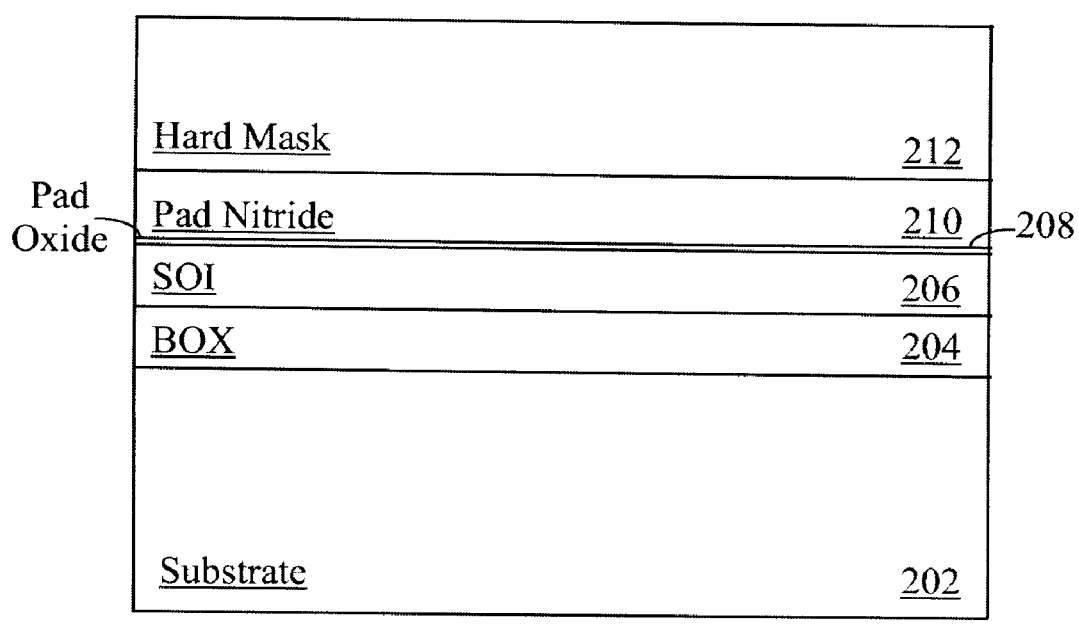

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

Conventional electronic components may be labeled with conventional schematic-style references comprising a letter (such as A, C, Q, R) indicating the type of electronic component (such as amplifier, capacitor, transistor, resistor, respectively) followed by a number indicating the iteration of that element (such as "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown. Usually, lines in a schematic diagram which cross over one another and there is a dot at the intersection of the two lines are connected with one another, else (if there is no dot at the intersection) they are typically not connected with one another.

In the drawings accompanying the description that follows, both reference numerals and legends (labels, text descriptions) may be used to identify elements. If legends are provided, they are intended merely as an aid to the reader, and should not in any way be interpreted as limiting.

FIG. 1 is a cross-sectional view of a FET, according to the prior art.

FIG. 2 is a cross-sectional view of an SOI substrate, according to the prior art.

FIGS. 3A-3H are cross-sectional views of a process for forming a DT MIM capacitor, according to an illustrative embodiment of the invention.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. Well-known processing steps and materials are generally not described in detail in order to avoid unnecessarily obfuscating the description of the present invention.

Throughout the descriptions set forth in this disclosure, lowercase numbers or letters may be used, instead of subscripts. For example Vg could be written Vg. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "Vs" (source voltage) or "H2O" (water). For consistency of font size, such acronyms may be written in regular font, without subscripting, using uppercase and lowercase—for example "Vs" and "H2O".

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula SiO2. For example, silicon nitride (stoichiometrically Si3N4, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

As used herein, the term semiconductor fabrication or process or device may refer to standard CMOS processing and devices. CMOS is a widely used type of semiconductor product, that uses both NMOS (negative polarity) and PMOS (positive polarity) devices and circuits. Generally, unless otherwise stated, the polarities of any device disclosed herein may be reversed, "p" for "n", which may (or may not) require that other associated devices are also implemented with opposite polarity.

Deep Trench (DT) eDRAM

Deep trench eDRAM has become a standard feature in advanced CMOS technologies. This is largely due is its competitive advantage over SRAM as cache memory. The advantage comes from its greatly increased cell density. The speed requirement for the eDRAM does not have to match SRAM speeds to be competitive, but it should be as fast as possible.

A major challenge with trench eDRAM is etching the trenches deep enough to achieve the required capacitance. A promising way to alleviate the need for deep trenches is to increase the unit area capacitance through the use of a high-k node dielectric. Hafnium Oxide (HfO2, sometimes abbreviated "HFO") is an attractive candidate material due to its very high k value (~23), its thermal stability, and the conformality of ALD deposition that allows it to be deposited in high aspect ratio trenches.

One technical challenge in implementing HfO is the need for an oxide layer between the As-doped silicon buried plate and the HfO deposition. The oxide layer greatly reduces the effective dielectric constant of the composite node dielectric.

In the eDRAM capacitor application, their is a further need to have the work functions of the node and plate conductors matched.

An embodiment of a process of forming a deep trench (DT) metal-insulator-metal (MIM) capacitor will now be described.

Figure 3A:
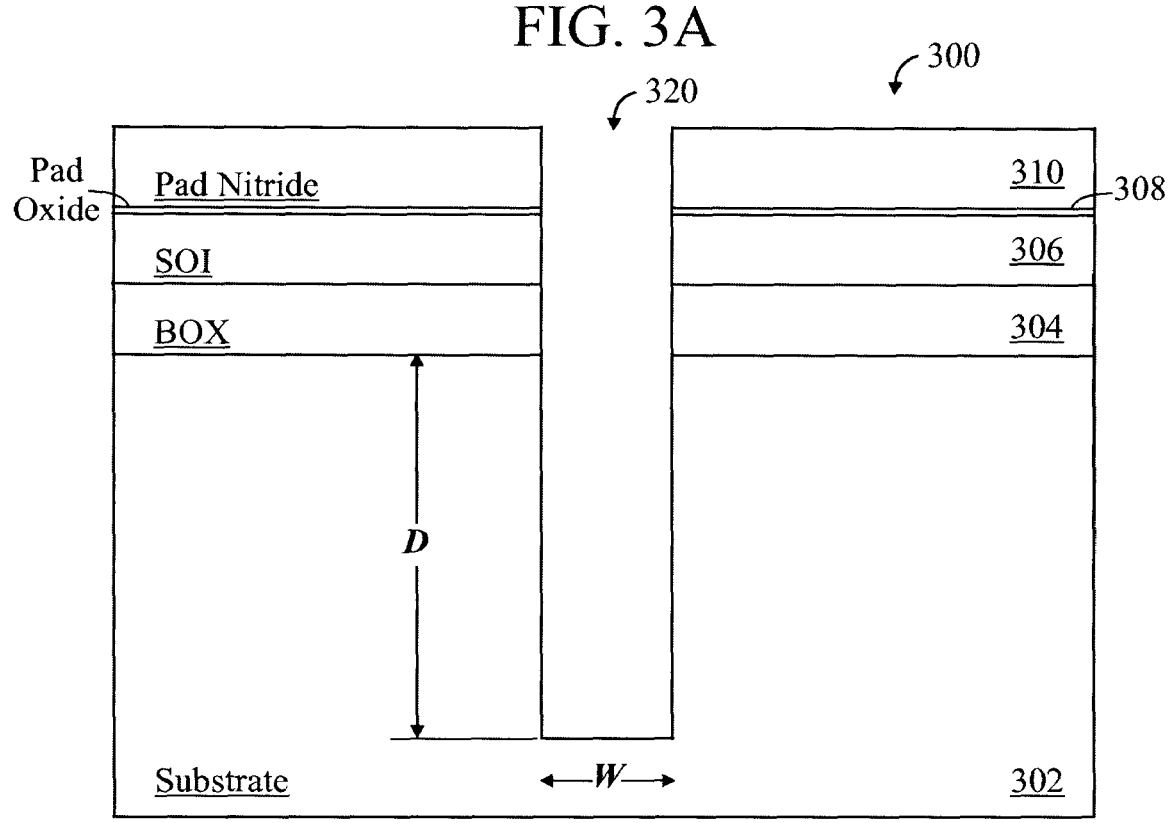

FIG. 3A illustrates a first step (DT silicon RIE) in the process of forming the DT MIM capacitor. Starting with a standard SOI substrate, such as the SOI substrate 200 shown in FIG. 2, standard deep trench (DT) lithography is performed. Generally, an opening is made in a hard mask (not shown, see 212) and RIE is performed to form a deep trench 320 extending through the pad nitride 310 (compare 210), pad oxide 308 (compare 208), SOI layer 306 (compare 206), BOX 304 (compare 204) and into the underlying substrate 302 (compare 202). After DT etch, the hard mask may be removed.

As shown in FIG. 3A, the deep trench (DT) 320 may have a depth "D" of approximately 2000-5000 nm (2-5 microns), a width "W" of approximately 50-150 nm. The deep trench (DT) is much deeper than it is wide, having (for example) an aspect ratio (D:W) of approximately 40:1.

The "deep trench" or "DT" itself may be considered to be only that part of the overall trench which is within the substrate 302, not including the part of the trench which extends through the BOX 304 and SOI 306, generally because that is where the DT capacitor will be formed. The top part of the overall trench, in the BOX 304 and SOI 306 may be referred to as an extension of the deep trench, or may be included in a reference to the overall trench.

FIG. 3B illustrates a next step (TiN plate) in the process of forming the DT MIM capacitor. A thin, conformal layer 322 of low-resistivity titanium nitride (TiN) may be deposited, having a thickness, for example of 5-10 nm. This material, lining the deep trench, is a conductor, and will serve as one of the two conductive electrodes for the capacitor being formed in the deep trench (DT) 320, substituting for (serving the function of) the conventional buried plate (see FIG. 1) which usually surrounds the trench. It is within the scope of the invention that this TiN plate can be combined with a conventional implanted "buried" plate 324, shown in dashed lines, formed in the underlying substrate 302 surrounding the trench 320. (The buried plate 324 will be omitted from subsequent views, for illustrative clarity.

In this step, a portion of the conductive material (TiN) 322 may be removed from the top portion of the overall trench, so that it does not contact the SOI 306. As shown in FIG. 3B, the TiN 322 is shown a having been recessed to the bottom of the BOX layer 304. Generally, the top of the TiN, after being recessed, should be anywhere above the top surface of the substrate 302, and below the bottom surface of the SOI layer 306. The TiN could be recessed even lower, so that the top of the TiN is within the underlying substrate 302, and there may be process considerations that drive such a choice, but that would slightly reduce its overall surface area within the deep trench. And, generally, "more surface area means more capacitance" (so less surface area would mean less capacitance).

Figure 3C:
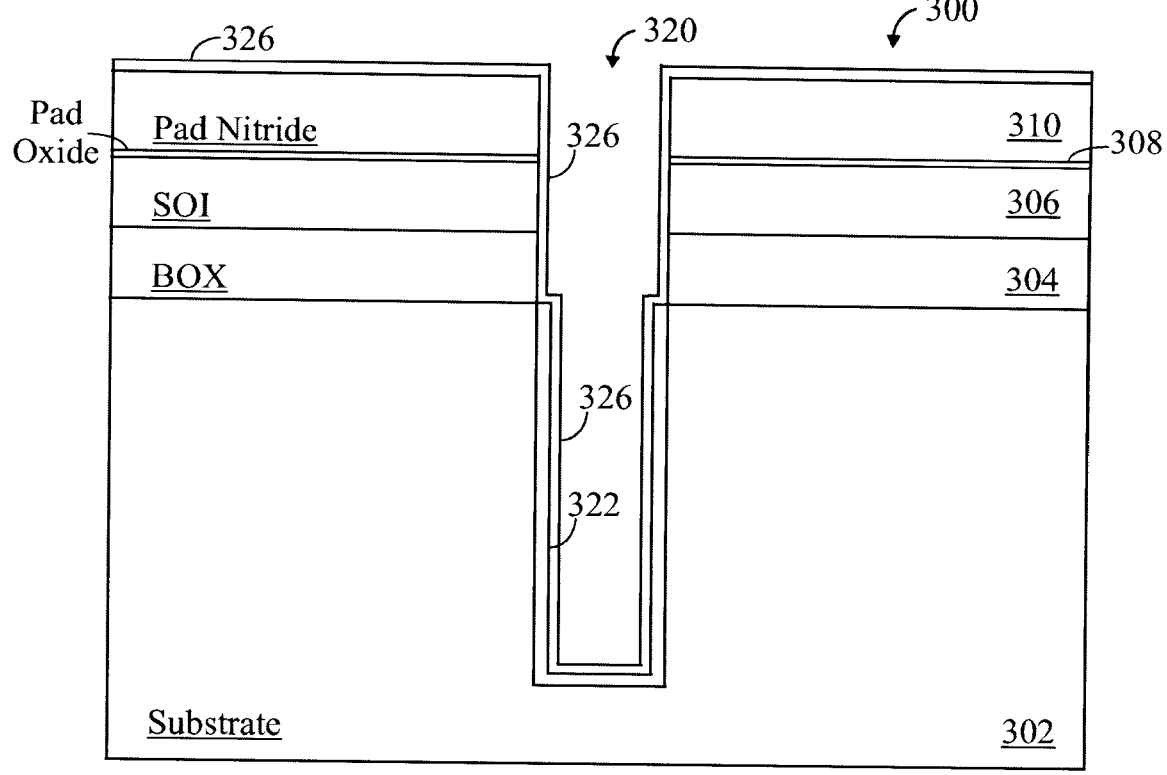

FIG. 3C illustrates a next step (HfO ALD) in the process of forming the DT MIM capacitor. A thin layer 326 of high-k dielectric is deposited. This may be hafnium oxide (Hf02), deposited by atomic layer deposition (ALD), and may have a thickness of 2-6 nm, or less.

The high-k dielectric 326 covers the sidewalls and bottom of the trench 320, including the TiN 322, including the bottom of the trench 320, including the extension portion of the trench 320 where it passes through the BOX 304 and the SOI 306, and including covering the top surface of the pad nitride 310. The high-k dielectric 326 covers every exposed surface, substantially uniformly. The high-k dielectric 326 covers the TiN 322.

Figure 3D:
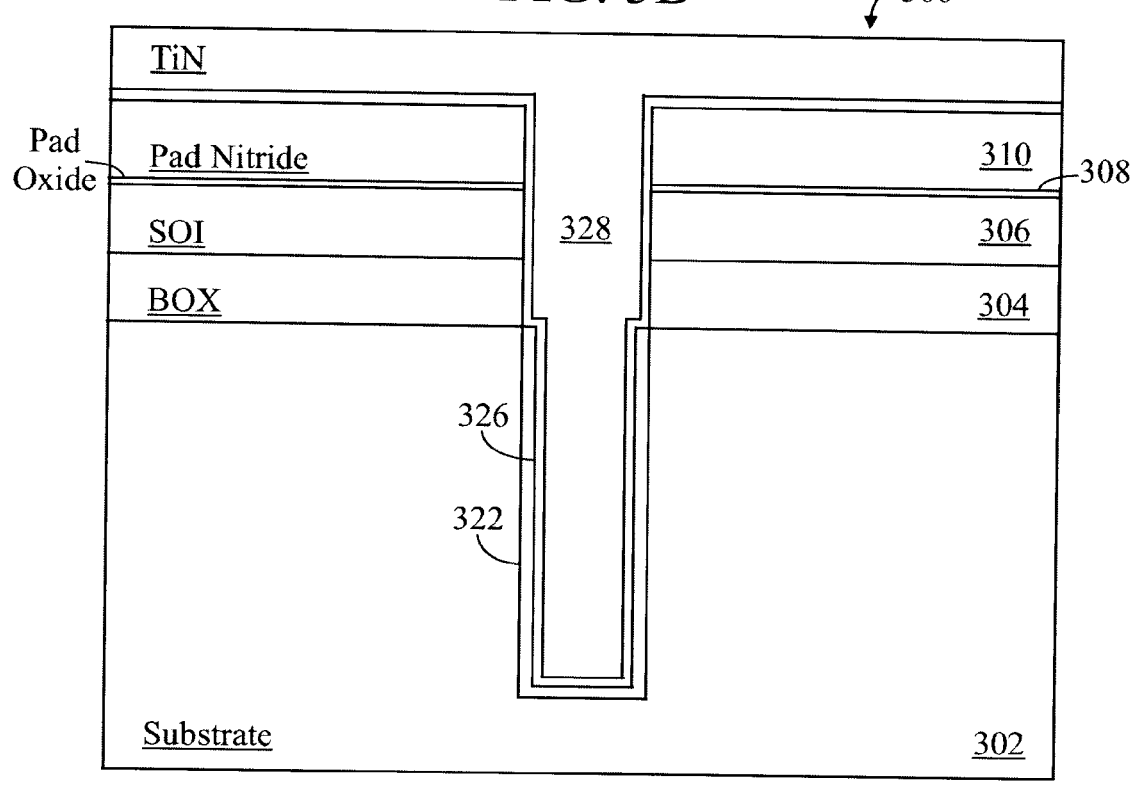

FIG. 3D illustrates a next step (TiN (ALD or MOCVD)) in the process of forming the DT MIM capacitor. The trench 320 is filled with a conductive material 328, such as TiN, to form (serve as) the "inner electrode" of the capacitor, covering the dielectric 326. Alternatively, the trench fill may be a thin "liner" of TiN, followed by a thick deposition of poly (poly-silicon). Suitable deposition processes such as ALD, or MOCVD (metalorganic CVD) may be employed to deposit these materials.

At this stage of the process, a "basic" capacitor has been formed, comprising:
 a first, outer plate 322
 a dielectric (insulator) 326
 a second, outer plate 328

Figure 3E:
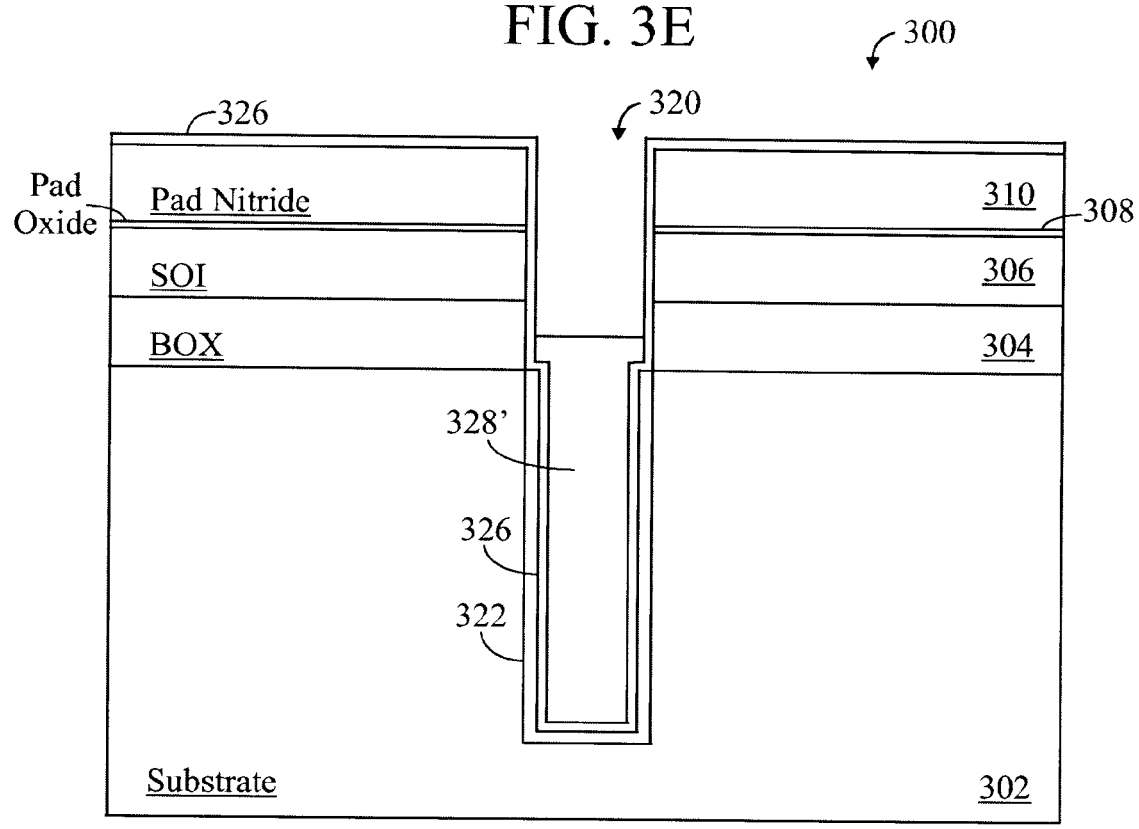

FIG. 3E illustrates a next step (TiN recess RIE) in the process of forming the DT MIM capacitor. In this step, the conducive material 328 (TiN, or TiN/poly) is recessed to so that its top surface is recessed below the bottom surface of the SOI 306, and not deeper than bottom of BOX 304. If recessed too deep, the dielectric would be exposed. If recessed too shallow, this would interfere with forming a strap connection to the SOI. In other words, the top surface of the conductive material 328' (prime) should be within the opening in the BOX layer 304 (between the bottom and top surfaces of the BOX).

Note that there may be residual dielectric material 326 on the top of the substrate and in the upper part of the trench 320, but this will be coming off in the next step.

Figure 3F:
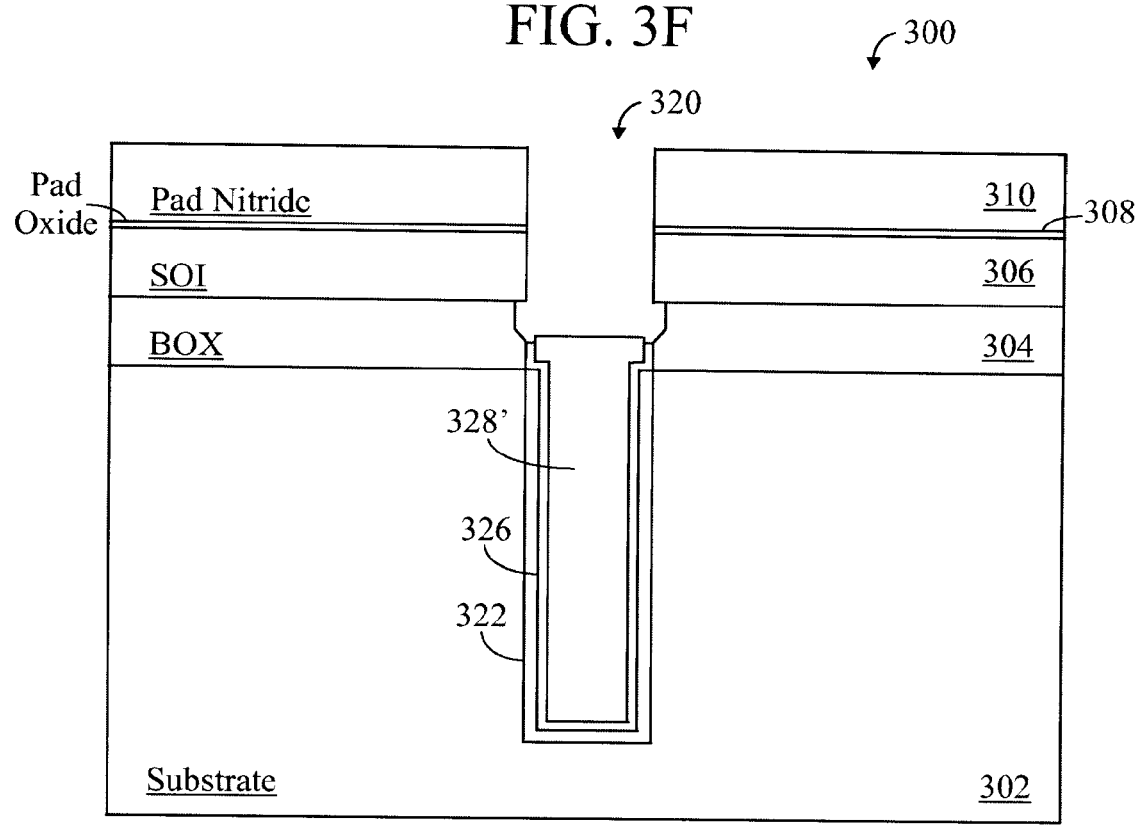

FIG. 3F illustrates a next step (HfO etch) in the process of forming the DT MIM capacitor. The residual dielectric material (HfO), mentioned in the previous step, is now removed, using a suitable etch step. Note that in this step, as the dielectric material (326) is being etched, a top portion of the BOX 304 (which is above the top of the conductive material 328') may also be etched back, exposing some of the underside of the SOI 306.

Figure 3G:
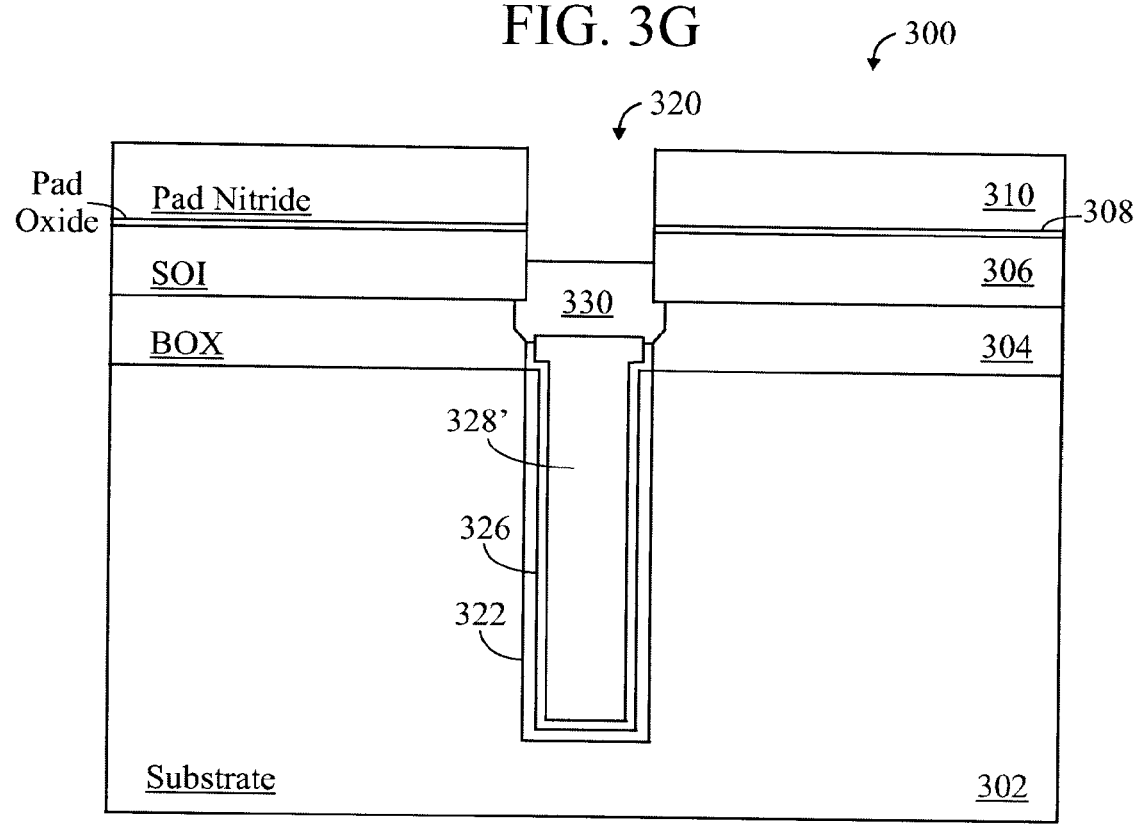

FIG. 3G illustrates a next step (Intrinsic poly dep, recess, As implant) in the process of forming the DT MIM capacitor. Intrinsic (not doped) polysilicon (poly) is deposited, and etched back, to form a strap 330 on top of the conductive material 328'. The strap 330 is disposed substantially within the opening in the SOI layer 306, for making an electrical connection therewith. The poly strap 330 should be recessed to below the top surface of the SOI 306, but above the bottom surface of the SOI 306.

Figure 3H:
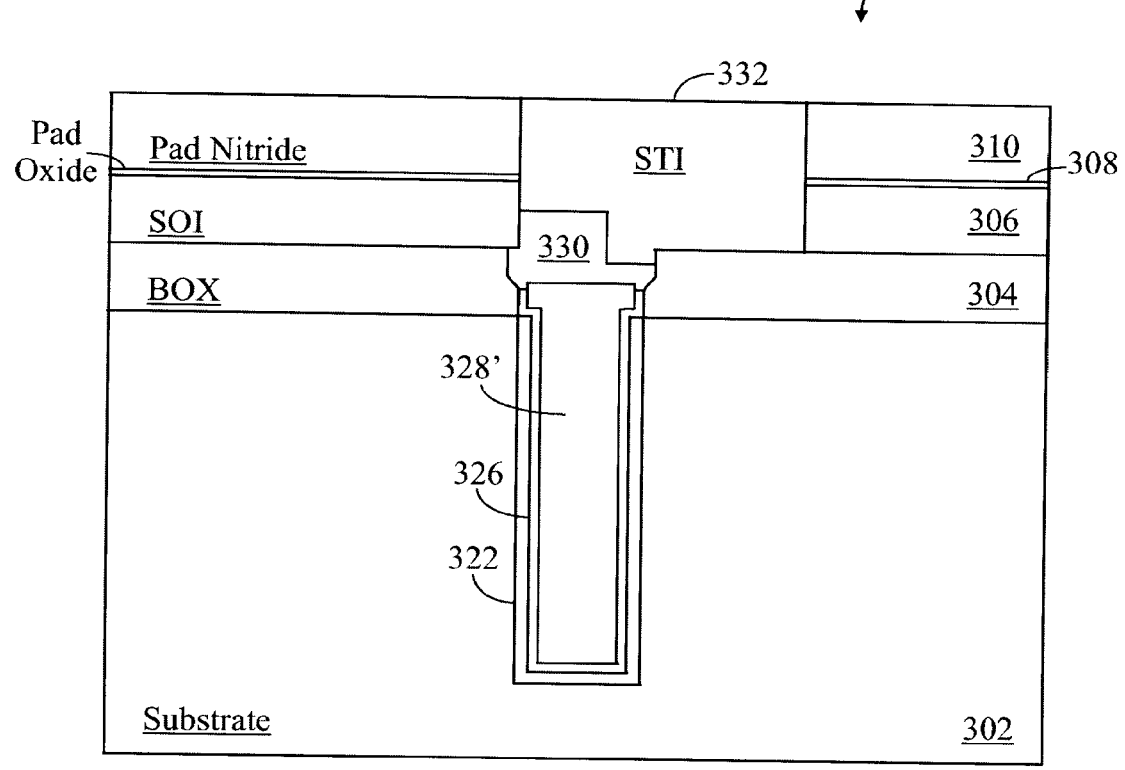

FIG. 3H illustrates a next step (STI) in the process of forming the DT MIM capacitor. Conventional shallow trench isolation (STI) 332 may be formed.

There has thus been shown an example of forming a capacitor, using MIM technology, in a deep trench. The capacitor comprises two conductive electrodes 322 and 328', such as TiN, separated by a dielectric 326, such as a high-k dielectric, such as hafnium oxide (HFO2, or "HfO"). The example is shown in an SOI substrate, but is not limited thereto.

The aforementioned U.S. Pat. No. 7,276,751 describes the simultaneous formation of the DT capacitor fill metal and the contact fill metal, which requires that the DT fill extends above the SOI surface. In contrast thereto, in the present invention the DT capacitor is fully formed before the device layer, and is completely buried below the SOI surface. This allows for subsequent structures (not shown) to be placed (formed) over the DT, and thereby allows for denser eDRAM arrays.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. Method of forming a deep trench metal-insulator-metal (MIM) capacitor in an SOI-type substrate having a layer of silicon (SOI) atop a buried oxide (BOX) layer which is atop an underlying substrate, comprising:
    forming a deep trench (DT) extending through the SOI layer and the BOX layer, and into the underlying substrate;
    depositing a thin, conformal layer of a first conductive material to serve as a first of two conductive electrodes for a capacitor being formed in the deep trench;
    removing a portion of the first conductive material from a top portion of the deep trench, recessing it to below the SOI layer;
    depositing a dielectric layer covering sidewalls and a bottom of the deep trench, and the first conductive material;
    filling the deep trench with a second conductive material, to serve as a second of the two conductive electrodes for a capacitor being formed in the deep trench; and
    recessing the second conductive material so that its top surface is recessed below the SOI layer.

2. The method of claim 1, wherein:
the underlying substrate is a silicon substrate;
the BOX layer has a thickness of 500-2500 Å; and
the SOI layer has a thickness of 50-200 Å.

3. The method of claim 1, wherein:
the deep trench (DT) has a depth of 2000-5000 nm and a width of 50-150 nm.

4. The method of claim 1, wherein:
the first conductive material comprises titanium nitride (TiN).

5. The method of claim 1, wherein:
the first conductive material has a thickness of 5-10 nm.

6. The method of claim 1, further comprising:
forming a buried plate in the underlying substrate, surrounding the deep trench.

7. The method of claim 1, wherein:
the first conductive material is recessed to be above a top surface of the underlying substrate.

8. The method of claim 1, wherein:
the first conductive material is recessed to be within the underlying substrate.

9. The method of claim 1, wherein:
the dielectric layer comprises hafnium oxide.

10. The method of claim 1, wherein:
the dielectric layer has a thickness of 2-6 nm.

11. The method of claim 1, wherein:
the second conductive material comprises titanium nitride (TiN).

12. The method of claim 1, wherein:
the second conductive material comprises a thin liner of titanium nitride (TiN) followed by a thick deposition of polysilicon.

13. The method of claim 1, wherein:
the second conductive material is recessed to that its top surface is between bottom and top surfaces of the BOX layer.

14. The method of claim 1, further comprising:
etching to expose an underside of the SOI layer.

15. The method of claim 1, further comprising:
depositing polysilicon and etching it back to form a strap on top of the second conductive material.

16. The method of claim 15, wherein:
the polysilicon is etched back to below a top surface of the SOI layer and above a bottom surface of the SOI layer.

* * * * *